United States Patent
Ho

(10) Patent No.: US 7,403,930 B2
(45) Date of Patent: Jul. 22, 2008

(54) NEURAL NETWORK FOR DETERMINING THE ENDPOINT IN A PROCESS

(75) Inventor: Tsung-Hsuan Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 19 days.

(21) Appl. No.: 11/646,205

(22) Filed: Dec. 27, 2006

(65) Prior Publication Data

US 2007/0214098 A1    Sep. 13, 2007

Related U.S. Application Data

(63) Continuation of application No. 10/176,065, filed on Jun. 21, 2002, now abandoned.

(51) Int. Cl.
  *G06E 1/00*     (2006.01)
  *G06E 3/00*     (2006.01)
  *G06F 15/18*    (2006.01)
  *G06G 7/00*     (2006.01)

(52) U.S. Cl. .................................................. 706/20

(58) Field of Classification Search .................. None
  See application file for complete search history.

(56) References Cited

U.S. PATENT DOCUMENTS

| | | | | |
|---|---|---|---|---|
| 4,317,698 A | | 3/1982 | Christol et al. | |
| 4,945,257 A | * | 7/1990 | Marrocco, III | 338/38 |
| 5,220,202 A | * | 6/1993 | Isono et al. | 706/38 |
| 5,343,081 A | * | 8/1994 | Nakamura | 706/33 |
| 5,393,994 A | * | 2/1995 | Kobayashi et al. | 257/84 |
| 5,467,883 A | * | 11/1995 | Frye et al. | 216/60 |
| 5,475,341 A | * | 12/1995 | Reed | 327/566 |
| 5,589,692 A | * | 12/1996 | Reed | 257/23 |
| 5,653,894 A | | 8/1997 | Ibbotson et al. | |
| 5,677,783 A | * | 10/1997 | Bloom et al. | 359/224 |
| 5,737,496 A | * | 4/1998 | Frye et al. | 706/23 |
| 5,859,964 A | * | 1/1999 | Wang et al. | 714/48 |
| 5,961,923 A | * | 10/1999 | Nova et al. | 506/4 |
| 6,320,200 B1 | * | 11/2001 | Reed et al. | 257/40 |
| 6,329,139 B1 | * | 12/2001 | Nova et al. | 506/30 |
| 6,340,588 B1 | * | 1/2002 | Nova et al. | 506/16 |
| 6,608,386 B2 | * | 8/2003 | Reed et al. | 257/773 |
| 6,641,746 B2 | | 11/2003 | Houge et al. | |
| 6,844,582 B2 | * | 1/2005 | Ueda et al. | 257/295 |
| 6,889,216 B2 | * | 5/2005 | Nugent | 706/15 |
| 7,015,336 B2 | * | 3/2006 | Reed et al. | 549/59 |
| 7,028,017 B2 | * | 4/2006 | Nugent | 706/26 |
| 7,039,619 B2 | * | 5/2006 | Nugent | 706/15 |
| 7,107,252 B2 | * | 9/2006 | Nugent | 706/15 |

OTHER PUBLICATIONS

Towards real time fault identification in plasma etching using neural networks Zhang, B.; May, G.S.; Advanced Semiconductor Manufacturing Conference and Workshop, 1998. 1998 IEEE/SEMI Sep. 23-25, 1998 pp. 61-65 Digital Object Identifier 10.1109/ASMC.1998.731394.*

* cited by examiner

*Primary Examiner*—Michael B Holmes
(74) *Attorney, Agent, or Firm*—Jianq Chyun IP Office

(57) ABSTRACT

There is provided a system and method for pattern recognition of an endpoint curve for a dry etch process. The system trains a neural network with a group of training curves corresponding to the dry etch process, wherein the training curves contain normal and abnormal features. The system receives an endpoint curve at the neural network representing a dry etch process and detects an abnormal feature in the endpoint curve.

27 Claims, 19 Drawing Sheets

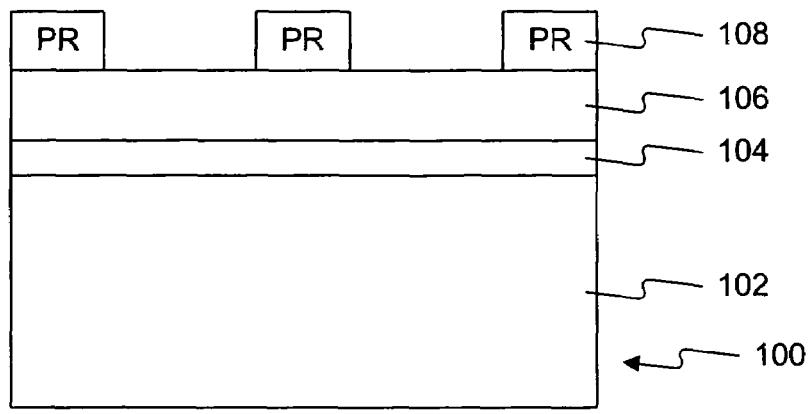
Figure 1A (Prior Art)
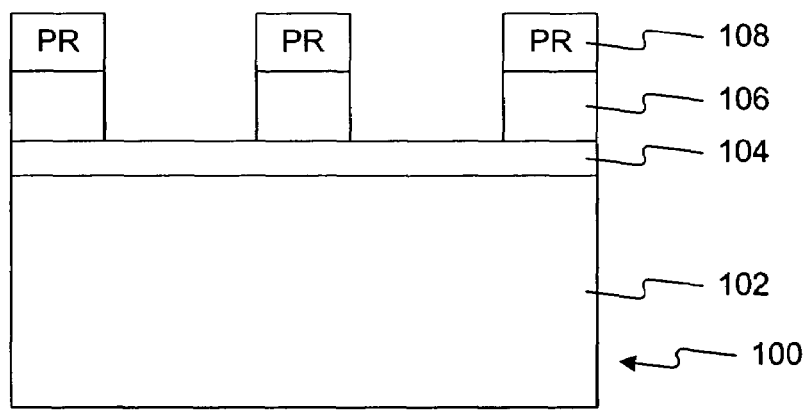
Figure 1B (Prior Art)
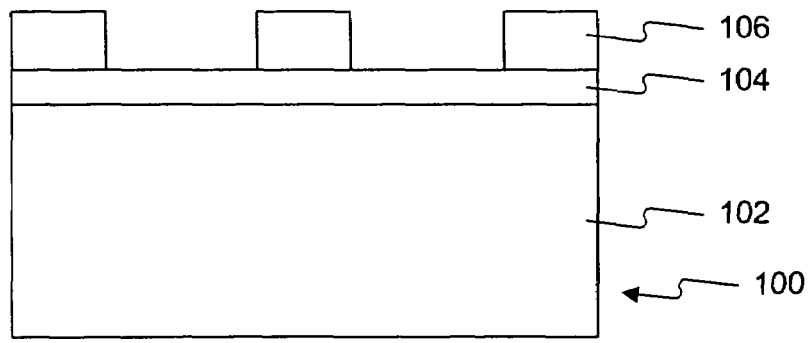
Figure 1C (Prior Art)

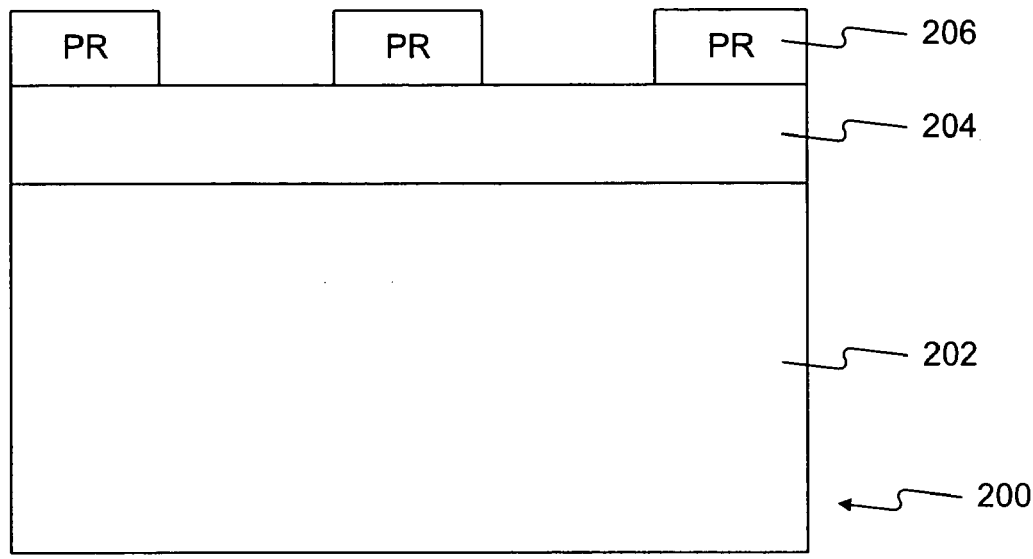
Figure 2A (Prior Art)
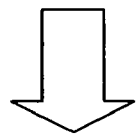
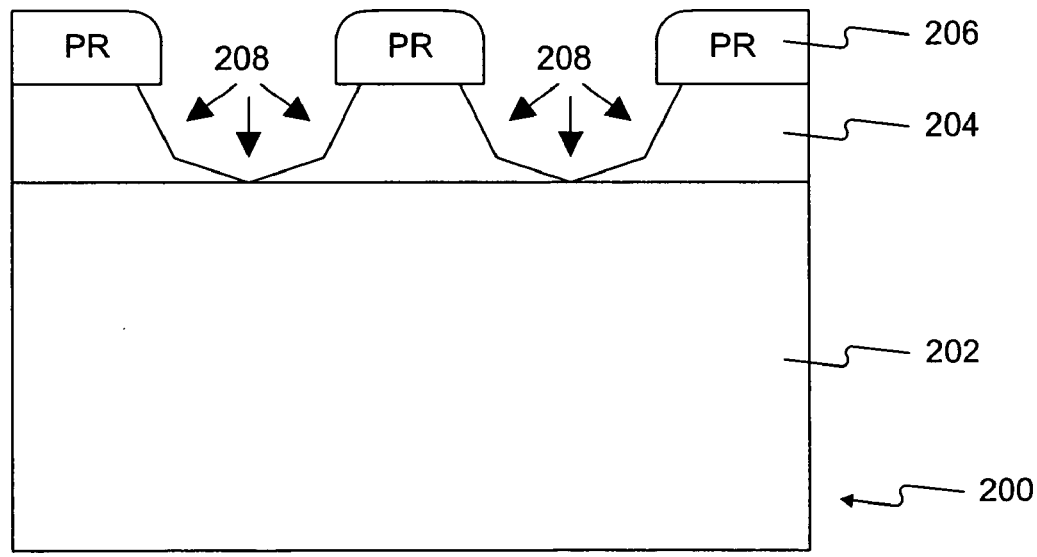
Figure 2B (Prior Art)

1400

1410

1420

NEURAL NETWORK FOR DETERMINING THE ENDPOINT IN A PROCESS

CROSS-REFERENCE TO RELATED APPLICATION

This application is a continuation of co-pending U.S. application Ser. No. 10/176,065 filed Jun. 21, 2002 now abandoned, entitled "Neural Network For Determining The Endpoint In A Process," the entire disclosure of which is incorporated herein by reference.

BACKGROUND OF THE INVENTION

1. Field of the Invention

This invention relates to endpoint detection in a semiconductor process utilizing a neural network.

2. Background

Today in semiconductor processing, different structures, such as trenches and vias in semiconductor devices are formed by etching processes. FIGS. 1A-1C illustrate the steps in a known process for etching a semiconductor device. As shown in FIG. 1A, a semiconductor device 100 comprises a silicon substrate 102, a polysilicon layer 104, and an insulating layer 106. On insulating layer 106 is deposited a photoresist layer 108. Photoresist layer 108 is patterned into a predetermined structure. The predetermined structure may be, for example, a via hole or trench. Photoresist layer 108 serves as a mask for the etching process.

Then, as shown in FIG. 1B, photoresist layer 108 functions as a mask during the etch process. In the etching process, insulating layer 106 is etched until polysilicon layer 104 is reached. Once polysilicon layer 104 is reached, the etch process is terminated. As shown in FIG. 1C, after the etching process is completed, photoresist layer 108 is removed. The etching process used may be, for example, a wet etching. Alternately, a dry etching, such as ion bombardment or plasma etching, may be preformed.

In semiconductor device manufacturing processes, dry etching is one technique for forming micropatterns. Dry etching is a method of generating plasma in a vacuum using a reactive gas and removing an etching target by using ions, neutral radicals, atoms, and molecules in the plasma. Etching is performed on an etching target until an underlying layer is reached. If etching is continued after the etched target is completely removed, the underlying material may be excessively etched, or the etching shape may be undesirably changed. Therefore, to obtain a desired structure, it is advantageous to detect the endpoint in the etching process accurately.

FIGS. 2A and 2B illustrate etching a semiconductor device by a dry etching process. As shown in FIG. 2A, a semiconductor device 200 comprises a silicon substrate 202, an insulating layer 204, and a photoresist layer 206. Photoresist layer (PR) 206 is patterned into a predetermined structure, such as a trench or via hole.

As shown in FIG. 2B, plasma gas reactant 208 is introduced to semiconductor device 200. Plasma reactant 208 reacts with layer 204, thereby etching layer 204. As plasma reactant 208 reacts with layer 204, a by-product is produced, the significance of which will be described hereinafter. Once layer 204 is etched so that substrate 202 is exposed, plasma reactant 208 is removed, thereby ending the etching process.

The point at which the etching process is stopped is called the endpoint. There are several methods in determining the endpoint in an etching process. Optical emission spectroscopy is one method for endpoint detection. Optical emission spectroscopy is easy to implement and offers high sensitivity. Optical emission spectroscopy relies on the change in the emission intensity of characteristic optical radiation from either a reactant or by-product in a plasma. Light is emitted by excited atoms or molecules when electrons relax from a higher energy state to a lower one. Atoms and molecules emit a series of spectral lines that are unique to each individual reactant or by-product. FIG. 3 is a graph illustrating the emission spectrum of exemplary by-products in a conventional etching process. As seen in FIG. 3, each different reaction product emits radiation at a different wavelength. The emission intensity is a function of the relative concentration of a species in the plasma. By observing the intensity of a particular by-product, the endpoint of the etch process may be determined.

A known system 400 utilized for endpoint detection is shown in FIG. 4. System 400 comprises a reaction chamber 410 which contains a semiconductor device 412 to be processed and a window 414. System 400 operates by recording with a recorder 440, such as a meter or oscilloscope, the emission spectrum, otherwise known as an endpoint curve, during the etch process in the presence and absence of the material that is to be etched. Emission radiation from the reaction passes through window 414 through a lens 420 and is received by a detector 430. Detector 430 is equipped with a filter that lets light of specific wavelengths pass through for detection. To detect the endpoint, the emission intensity of a particular reactant or by-product is monitored at a fixed wavelength and recorded on a recorder 440. When the end point is reached, the emission intensity changes. The change in emission intensity at the endpoint depends on individual reactant or by-product being monitored. The intensity due to reactant increases, while the intensity due to etch by-products decreases as the endpoint is reached.

FIG. 5 is a graph illustrating the emission spectrum intensity for a by-product in an etch process. As shown in the graph, as the etch process begins (502), the intensity of the emissions for the by-product from the reaction process increase as a function of the elapsed time (504). Then, as the etch process nears the endpoint (506), the emission intensity for the by-product decreases. Thus, the endpoint (506) can be determined by monitoring the emission of a reaction product for a decrease in intensity. FIG. 6 is a graph illustrating an experimental endpoint curve for a exemplary by-product. The endpoint is determined from observing the curve to locate normal features that denote an endpoint. Normal features are features which regularly occur in an endpoint curve.

Optical emissions spectroscopy also has some drawbacks. Oftentimes, it is difficult to determine the exact endpoint of an etching process. Such is the case when an endpoint curve contains abnormal features that may be hard to detect by conventional optical spectroscopy. Many times an over-etching is required. However, in the case of overetching, the underlying materials may be damaged.

SUMMARY OF THE INVENTION

In certain aspects consistent with the present invention, there is provided a system and method for determining an endpoint of an etching process by utilizing a neural network. By learning the features of a group of endpoint curves containing normal and abnormal features for an etch process, the neural network may determine the endpoint of the etch process through pattern recognition.

In one aspect consistent with the present invention, there is provided a system and method for pattern recognition of an endpoint curve for a dry etch process. The system trains a neural network with a group of training curves corresponding to the dry etch process, wherein the training curves contain normal and abnormal features. The system receives an endpoint curve at the neural network representing a dry etch process and detects an abnormal feature in the endpoint curve.

Additional features and advantages consistent with the present invention will be set forth in part in the description which follows, and in part will be obvious from the description, or may be learned by practice of the invention. The advantages consistent with the present invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate certain aspects consistent with the present invention and, together with the description, serve to explain the principles of the invention.

FIGS. 1A-1C are diagrams illustrating known etching processes for a semiconductor device;

FIGS. 2A-2B are diagrams illustrating known dry etching processes for a semiconductor device;

DESCRIPTION OF THE EMBODIMENTS

Reference will now be made in detail to aspects and features consistent with the present invention, examples of which are illustrated in the accompanying drawings. Wherever possible, the same reference numbers will be used throughout the drawings to refer to the same or like parts.

Certain aspects of the present invention overcome disadvantages of known endpoint detection systems and methods by utilizing a neural network. By learning the features of a group of endpoint curves containing normal and abnormal features for an etch process, the neural network may determine the endpoint of the etch process through pattern recognition.

A neural network is an interconnected assembly of simple processing elements, called nodes, whose functionality is loosely based on the human brain, in particular, the neuron. The processing ability of the network is stored in inter-node connection strengths, called weights, obtained by learning from a set of training patterns. Learning in the network is achieved by adjusting the weights based on a learning rule and training patterns to cause the overall network to output desired results.

Figure 3:
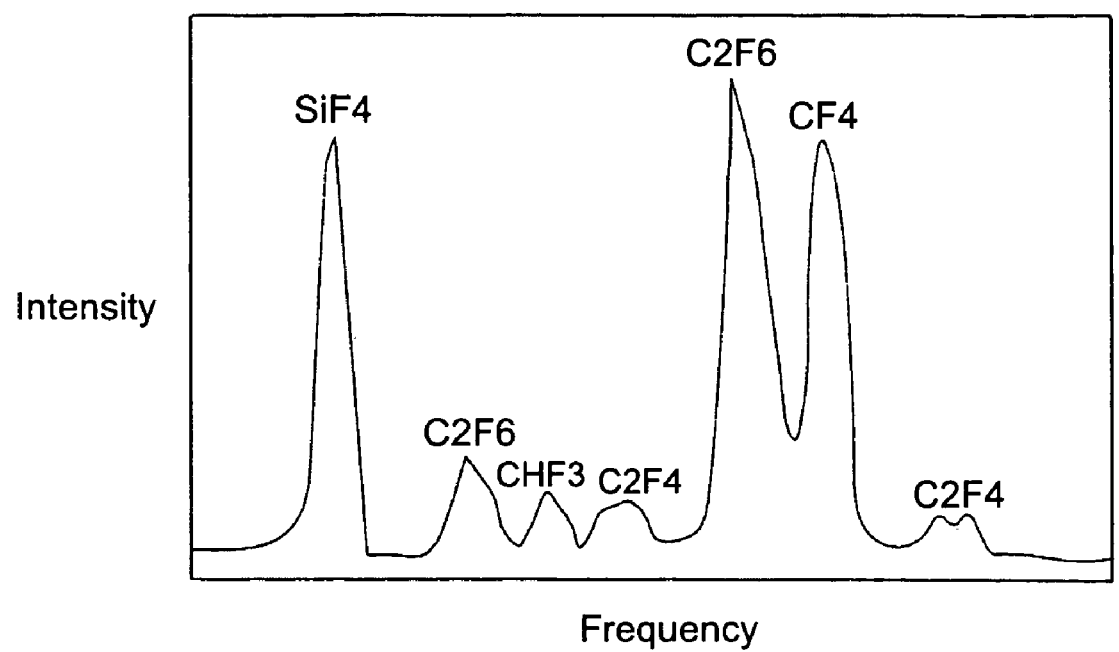
FIG. 3 is a graph illustrating the wavelengths of emissions for exemplary by-products for a dry etch process.
Figure 4:
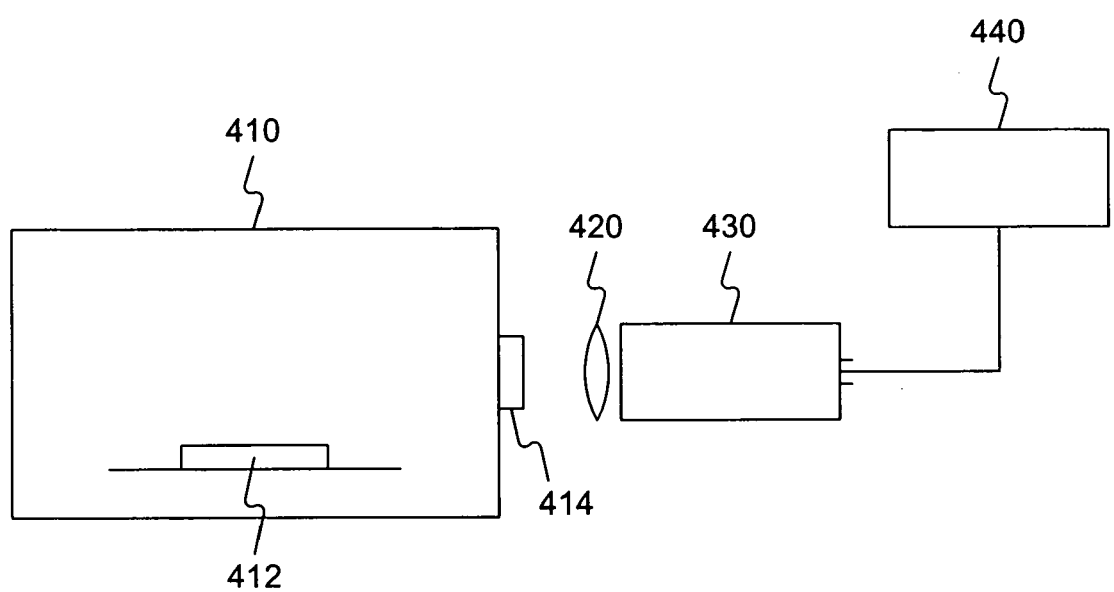
FIG. 4 is a diagram illustrating a known system for detecting the endpoint of a dry etch process.
Figure 5:
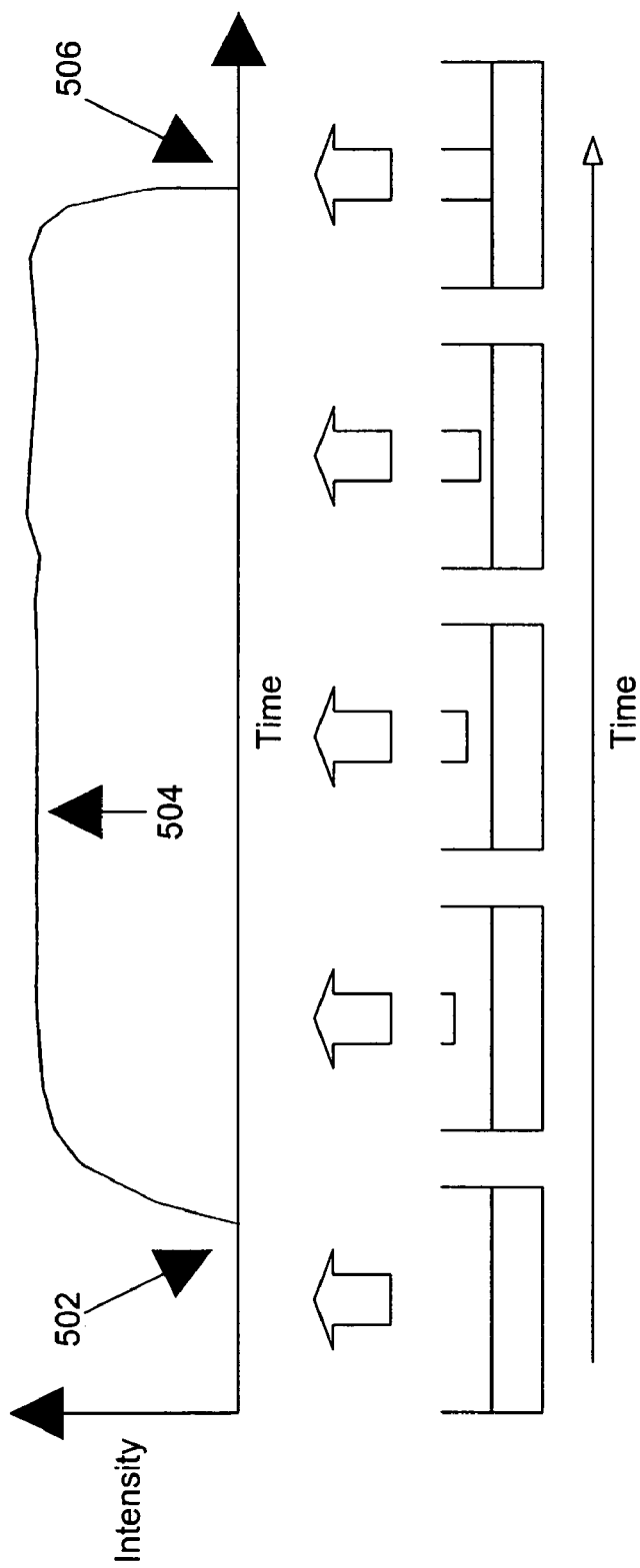
FIG. 5 is a graph illustrating the intensity of a particular exemplary by-product in a dry etch process.
Figure 6:
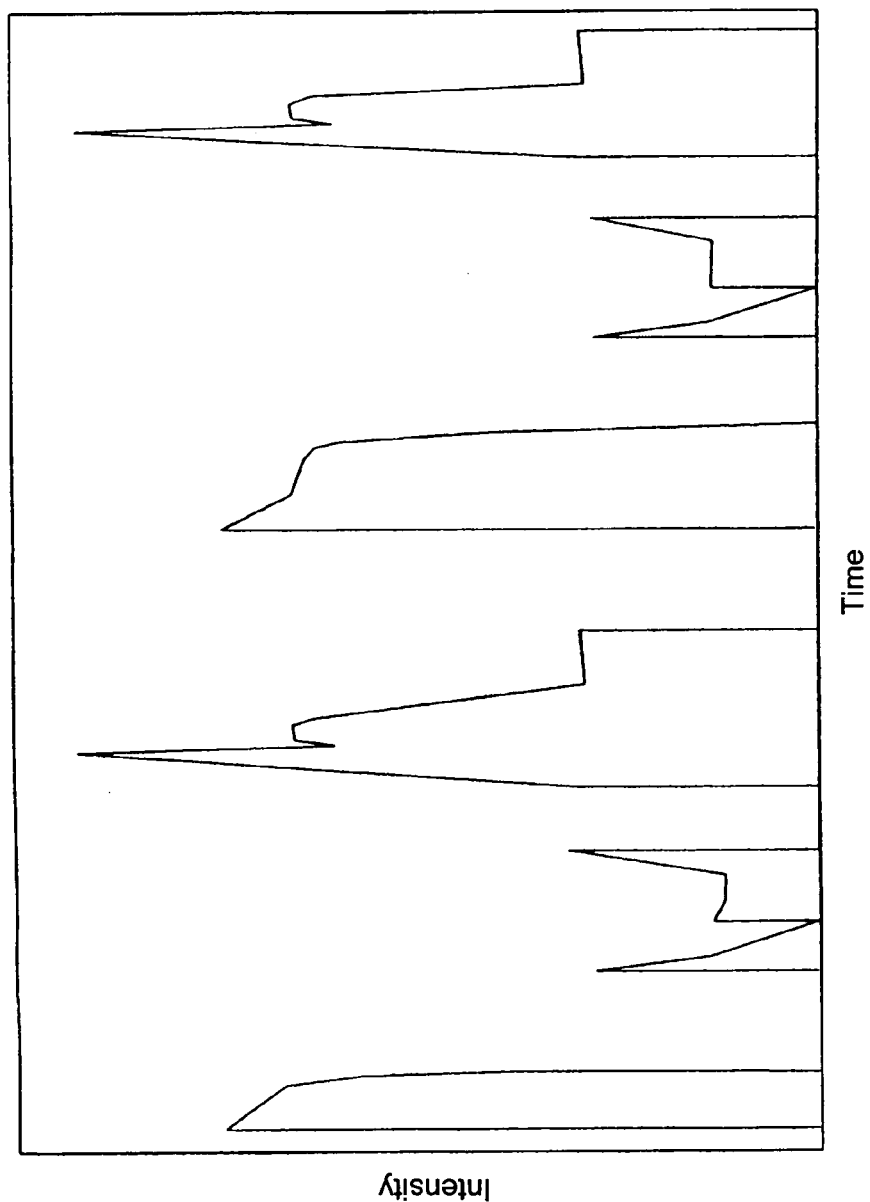
FIG. 6 is a graph illustrating an exemplary recorded endpoint curve.
Figure 7:
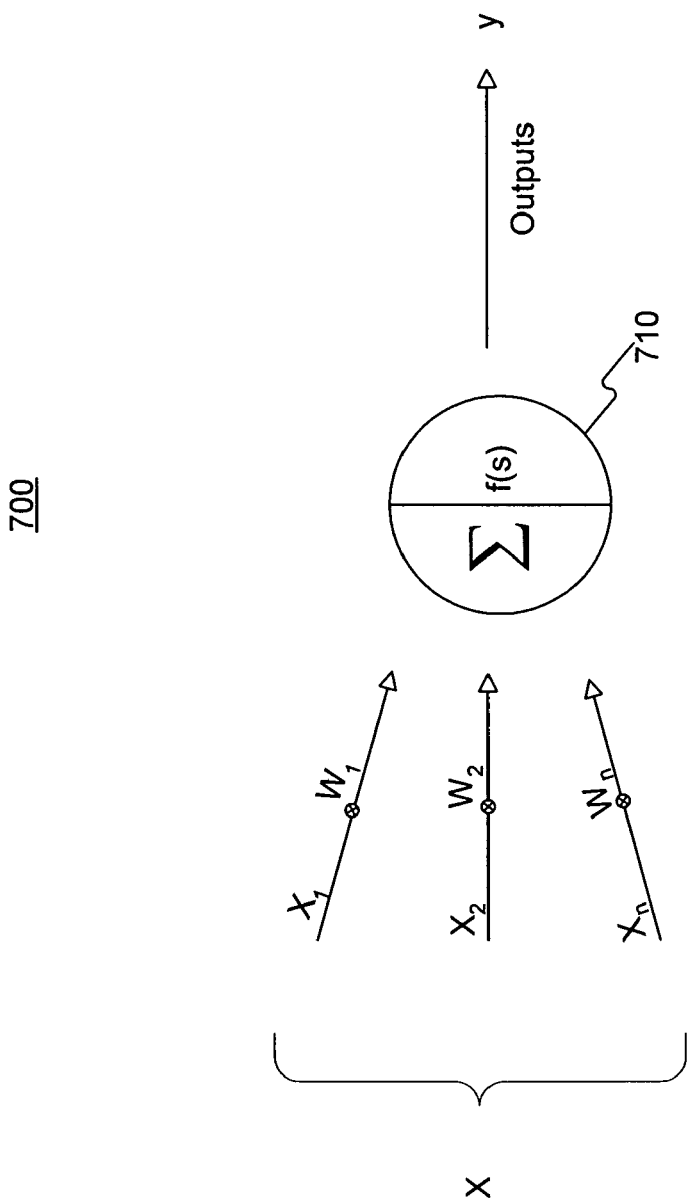
FIG. 7 is a diagram illustrating a node in a neural network.

The basic unit of a neural network is a node. FIG. 7 is an example of a neural network node 700. Neural network node 700 functions by receiving an input vector X composed of elements $x_1, x_2, \ldots x_n$. Input vector X is multiplied by a weight vector W composed of elements $w_1, w_2, \ldots w_n$. That is, each vector element is multiplied by a corresponding weight vector element. The resultant product is inputted into a linear threshold gate (LTG) 710. LTG 710 sums the product of X and W. The sum is operated on by a transfer function f(s). An output value y is output from LTG 710 after the sum is operated on by the transfer function f(s). For example, the transfer function f(s) may be a step function. In this case, if the sum is greater than the threshold of the step function, a binary 1 is output as y. If the sum is less than the threshold of the step function, a binary 0 is output as y.

Figure 8:
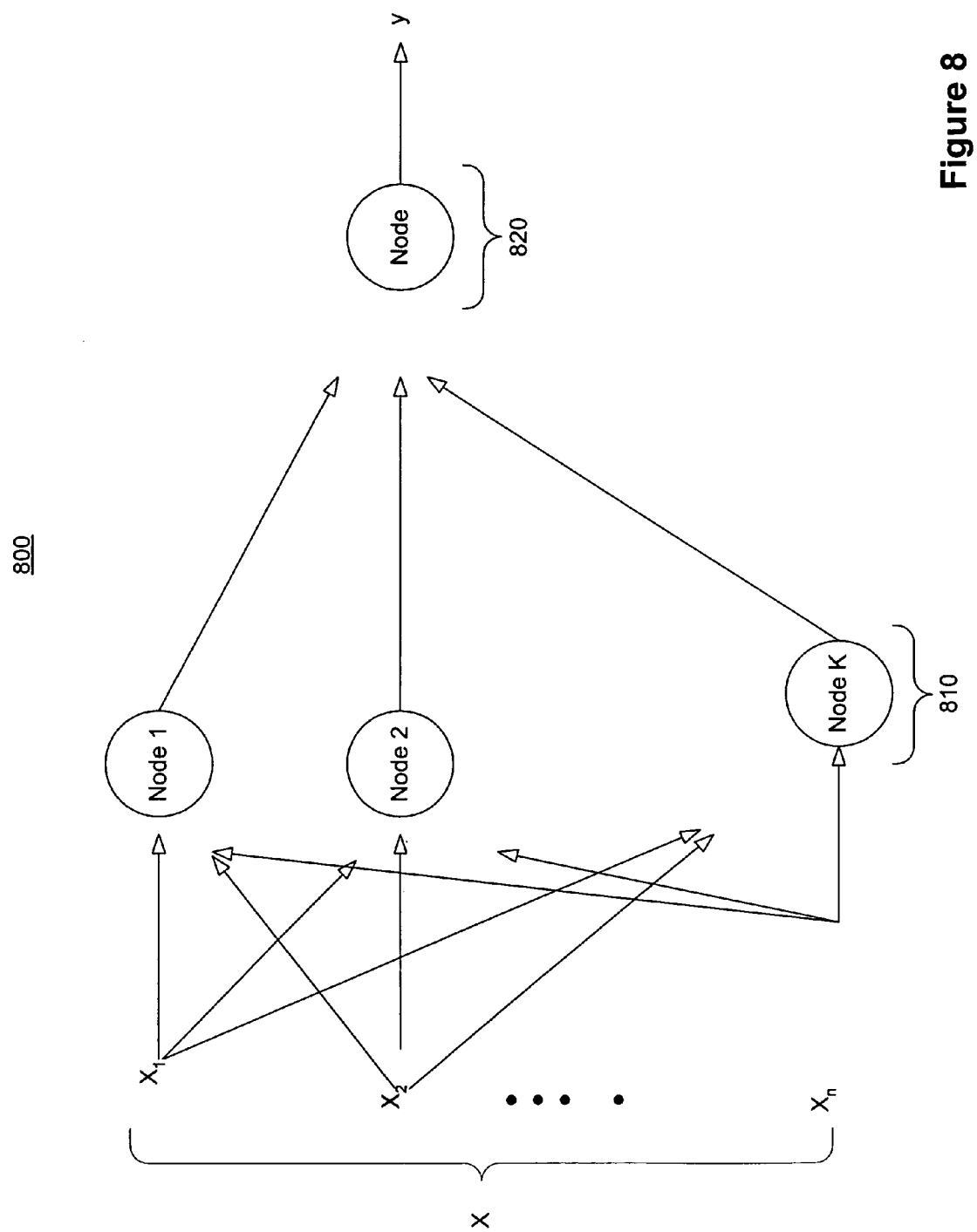
FIG. 8 is a diagram illustrating a neural network having two nodes.

A neural network is composed of multiple nodes arranged in layers. FIG. 8 is a diagram of a neural network 800. Neural network 800 is composed of two layers, a first layer 810 and a second layer 820. First layer 810 comprises k number of nodes. Second layer 820 comprises a single node. The nodes in first layer 810 and second layer 820 may be, for example, an LTG, such as LTG 710 illustrated in FIG. 7. Neural network 800 functions by receiving an input vector X composed of elements $x_1, x_2,$ and $x_n$ at first layer 810. First layer 810 processes input vector X and outputs the results to second layer 820. The nodes of first layer 810 may process input vector X by the method described for the node shown in FIG. 7. The results outputted from first layer 810 are inputted into second layer 820. Second layer 820 processes the results and outputs a result y. The node of second layer 820 may process the result from first layer 810 using the method described for the node shown in FIG. 7.

One advantage of neural networks is the ability to learn. The learning process of neural networks is facilitated by updating the weights associated with each node of a layer. The weights for each node in a layer may be updated based on a particular learning rule. One type of learning rule is a back-propagation (BP) learning rule. The BP learning rule dictates that changes in the weights associated with the learning process are based on errors between actual outputs and desired outputs. In the network, an error associated with the output of a node is determined and then back propagated to the weights of that node. A number of training sets are inputted into the network in order to train the network. The neural network processes each training set and updates the weights of the nodes based on the error between the output generated by the neural network and the desired output. BP learning rule neural networks may be used for pattern matching and classification.

Figure 9:
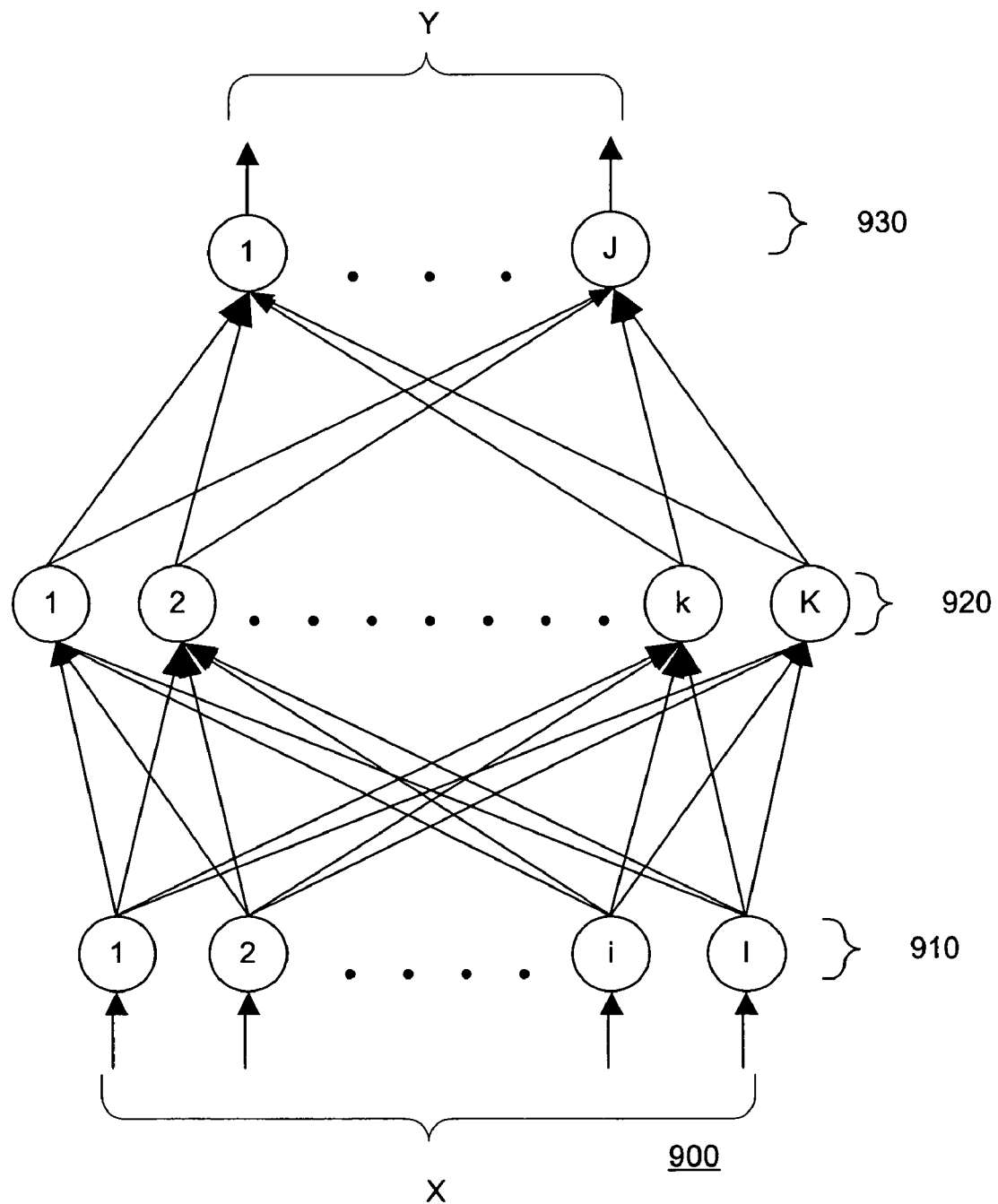
FIG. 9 is a neural network implementing a back propagation learning rule for endpoint detection in an etch process according to an aspect consistent with the present invention.

FIG. 9 is an example of a neural network 900 implementing a BP learning rule according to certain aspects related to the present invention. Network 900 serves as a pattern classification network to recognize normal and abnormal features in etch endpoint curves. Network 900 is trained by submitting a series of sample endpoint curves which contain characteristic features.

Neural network 900 comprises layers 910, 920, and 930. Layer 910 is an input layer and contains an l number of nodes. Layer 910 receives vector $X[x_1 \ldots x_i, x_n]$. Layer 920 is a hidden layer and contains a K number of nodes. Layer 920 is connected to input layer 910. Layer 930 is an output layer and contains a J number of nodes. Layer 930 is connected to layer 920 and serves to output the results of the neural network processing. The nodes of both layers may be LTG, as illustrated in FIG. 7. The number of nodes in each layer will be determined by the number of size of the input vector, the number of training endpoint curves, and the number of possible output.

Figure 10:
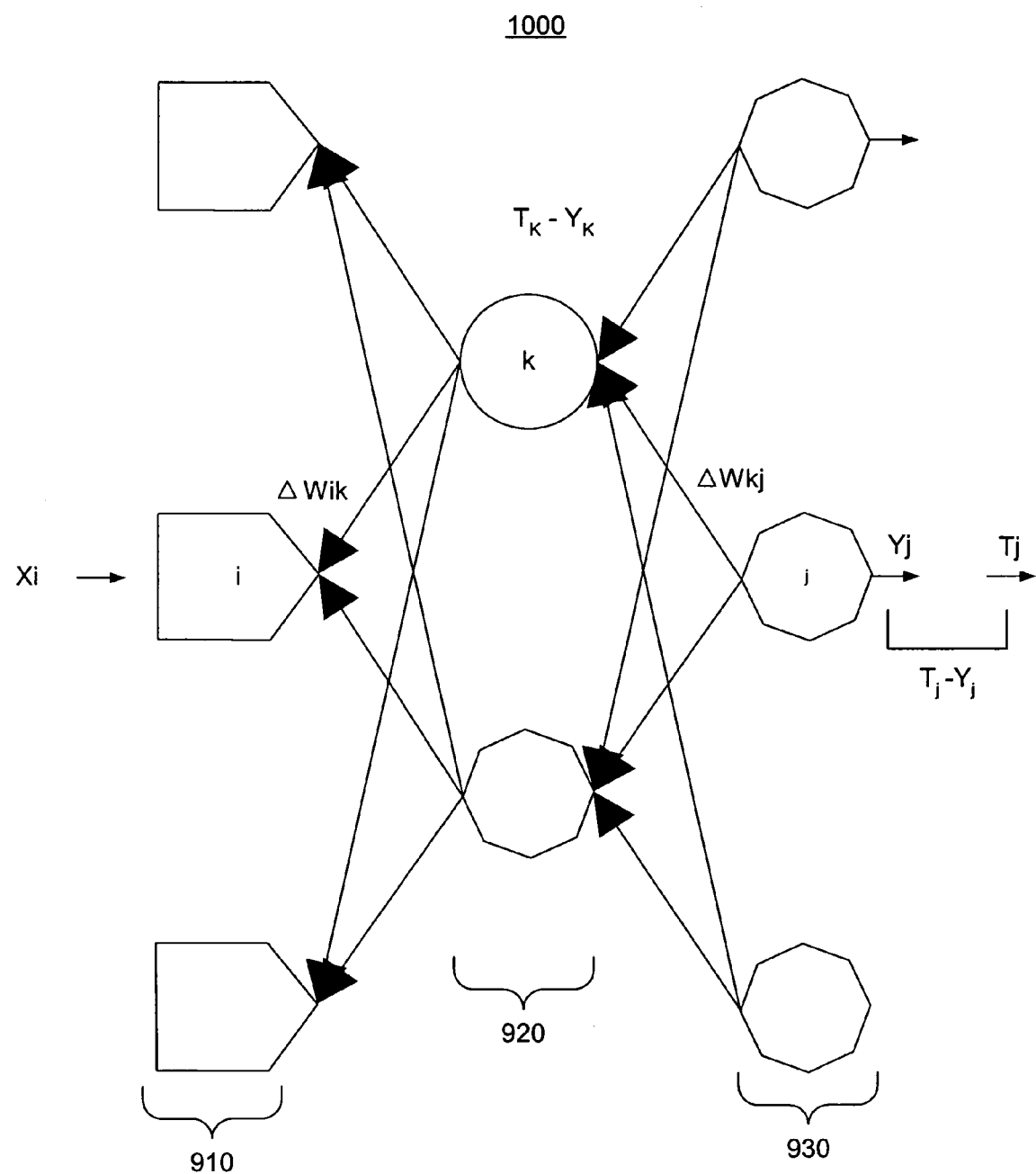
FIG. 10 is a method of training a neural network according to an aspect consistent with the present invention.

In order to train network 900 according to the BP learning rule, a series of training endpoint curves with characteristic features are fed to network 900. Network 900 processes the endpoint curves, in order to learn, by updating the weights. The learning process is described with reference to FIGS. 9 and 10 and equations 1-5. FIG. 10 is a diagram illustrating a learning process 1000 among the ith node of layer 910, the kth node of layer 920, and the jth node of layer 930. A transfer function for the nodes in layers 910, 920, and 930 may be a sigmoid function $f(s)$ expressed by equation:

$$f(s) = \frac{1}{1 + e^{-\alpha s}} \quad (1)$$

where $\alpha$ is a gain factor and s is a sum of the weighted inputs. One skilled in the art would realize that the transfer function is not limited to a sigmoid function, but may be another transfer function, for example, hyperbolic tangent given by $f(s)=\tanh(\beta s)$, where $\beta$ is a gain factor and s is a sum of the weighted inputs.

The weights $w_{kj}$ and $W_{ik}$ of layers 920 and 910 are updated by minimizing the following error function.

$$E(w) = \frac{1}{2}\sum_{j=1}^{J}(T_j - Y_j)^2 \quad (2)$$

where Yj is the output for the jth node of layer 930 and Tj is the desired output for the jth node of layer 930.

The weights for node 920 are updated according to the following equation:

$$\Delta w_{kj} = w_{kj}^{new} - w_{kj}^c = -\rho_0 \frac{\partial E}{\partial w_{kj}} = \rho_0(T_j - Y_j)f'(net_j)z_k \quad (3)$$

where $\rho$ is the learning rate, $$net_j = \sum_{k=0}^{K} w_{kj} z_k$$

which is the weighted sum otherwise known as s, $f'$ is the derivative of $f$ where f is given by equation 1 with respect to weight sum, $$\frac{\partial E}{\partial w_{kj}}$$

is the partial derivative of E(w) give by equation 2, and $w_{kj}^{new}$ and $w_{kj}^c$ are the updated and current weight values, respectively. The $z_k$ values are determined by propagating the input vector X through layer 920 according to $$z_k = f\left(\sum_{i=0}^{n} w_{ik} x_i\right) = f(net_k), k = 1 \ldots K \quad (4)$$

The weight for node 910 are updated according to the following equation:

$$\Delta w_{ik} = \rho_h[\Sigma(T_k - Y_k)f'(net_j)w_{kj}]f'(net_k)x_i \quad (5)$$

where $T_k$ is an "estimated target" for the kth node of layer 920 and $\rho_h$ is a learning rate. One skilled in the art would realized that the above equation may be adapted for other transfer functions, f(s).

Figure 11:
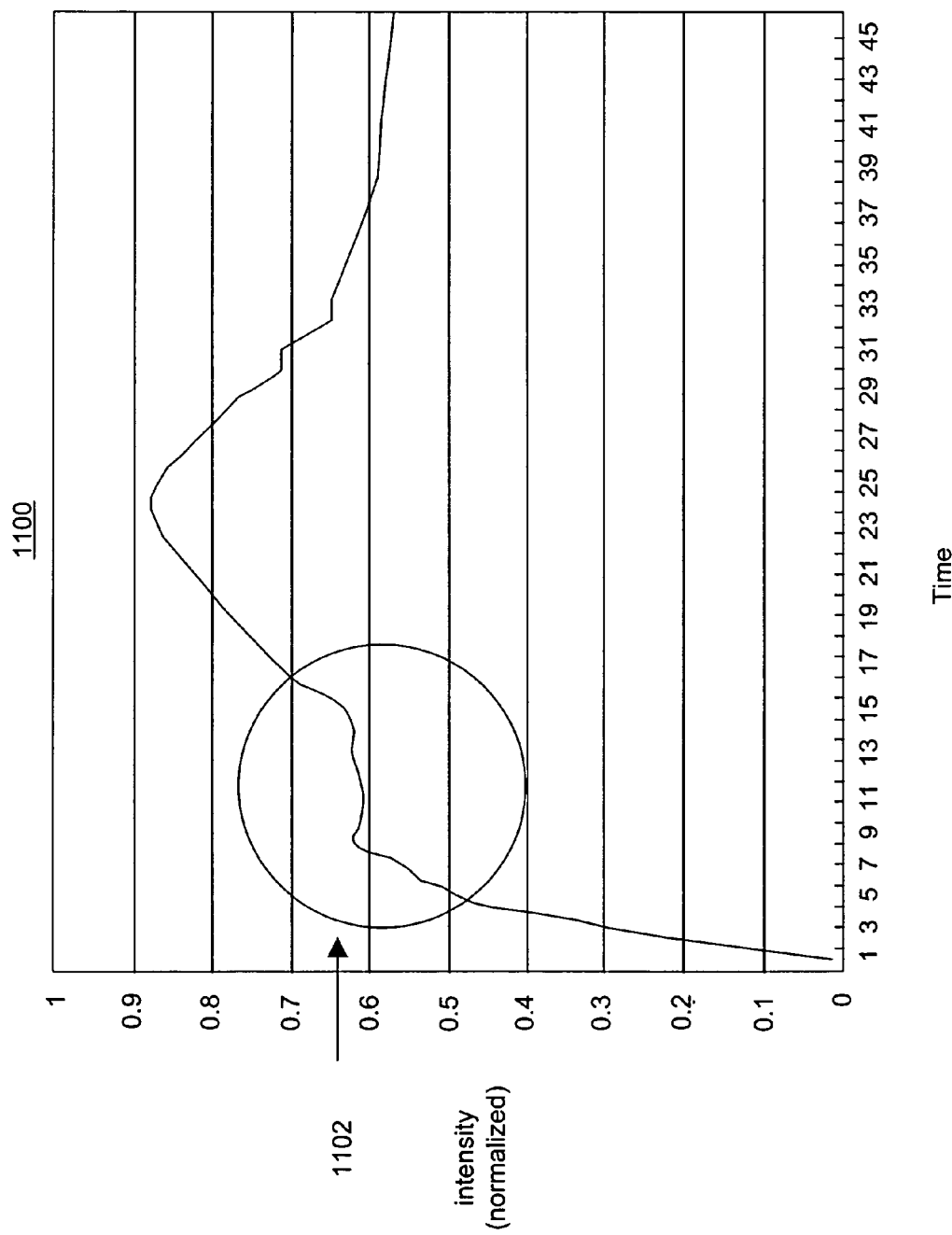
FIGS. 11 and 12 are graphs illustrating endpoint curves with stable and unstable front features, respectively.
Figure 12:
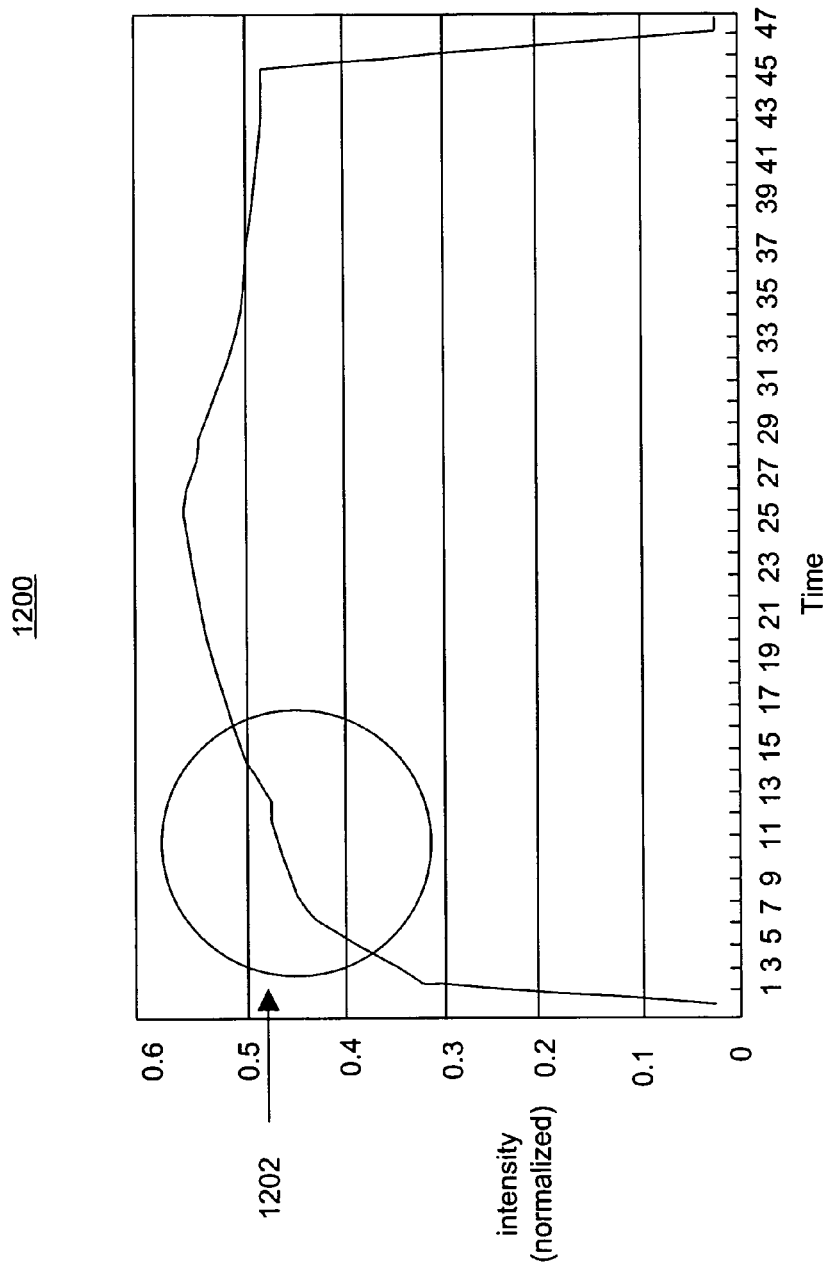

Network 900 is trained by inputting sample endpoint curves and training the network to recognize the endpoint curves by the characteristic features. FIGS. 11 and 12 are graphs illustrating sample endpoint curves with different characteristic features. FIG. 11 illustrates an endpoint curve 1100 which has a stable front feature 1102. A stable front feature is a feature in the endpoint curve in which the differential point or endpoint of the etch may be easily determined. In the case of stable front feature 1102, feature 1102 is defined by a leveling of the intensity. FIG. 12 illustrates an endpoint curve 1200 which has an unstable front feature 1202. An unstable front feature is a feature in the endpoint curve in which the differential point or endpoint of the etch may not be easily determined. In the case of unstable front feature 1202, feature 1202 is defined only by a slight leveling of the intensity.

Figure 13:
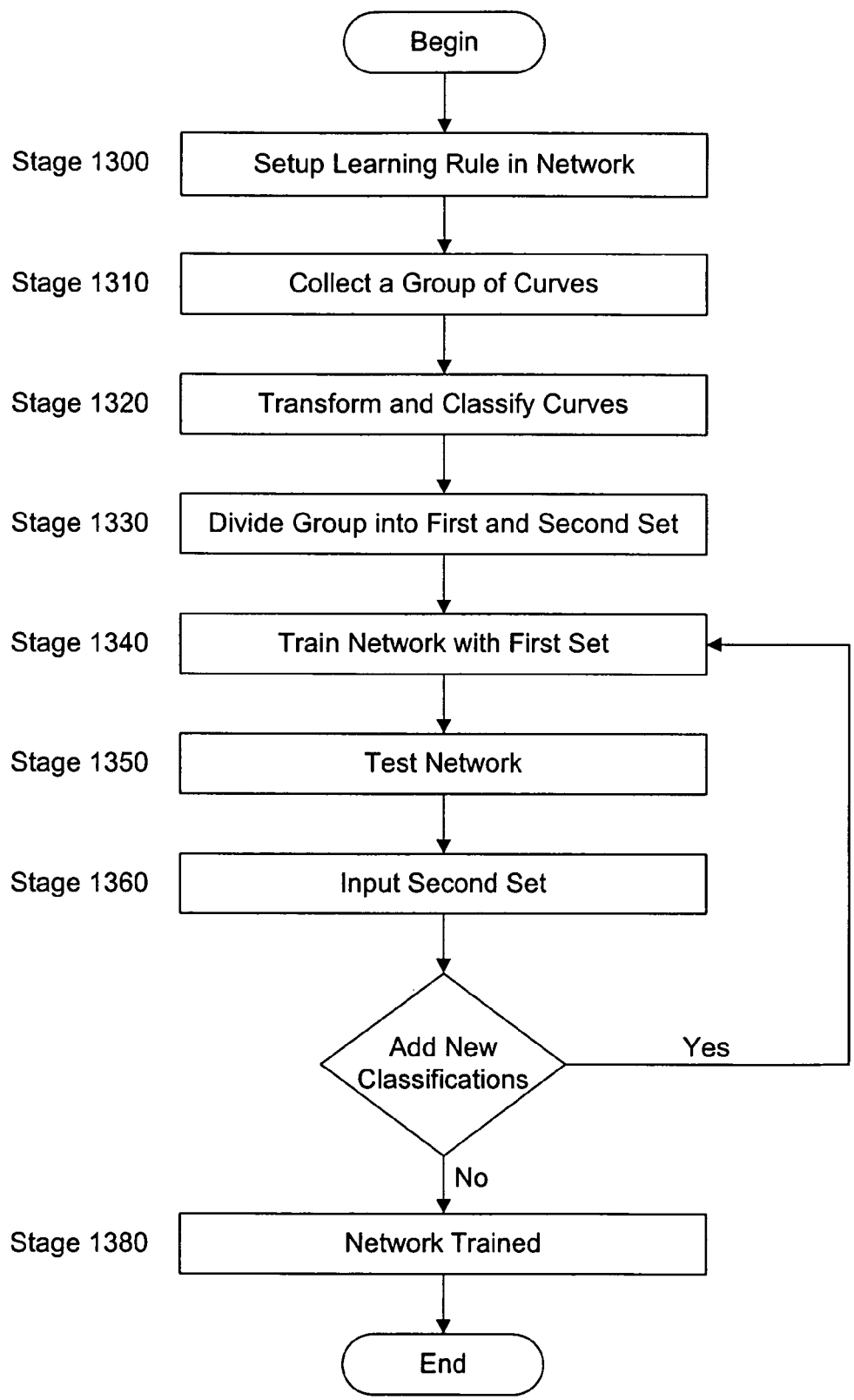
FIG. 13 is a flowchart illustrating a method for training a neural network.

Network 900 is trained by setting the desired output Tj to classify the desired features and then inputting endpoint curves 1000 as vector X repeatedly until the output of the network approaches the desired output. FIG. 13 is a flow chart illustrating the method for training network 900.

The method begins by setting up network 900 to use a back propagation learning rule such as the rule illustrated in FIG. 10 (stage 1300). Next, a group of curves are collected (1310). Then, the curves are transformed and classified (stage 1320) in a standard manner using the following equations:

$$V_m = \frac{V_{in} - V_{min}}{V_{max} - V_{min}} \text{ when } V_{min} < 0; \text{ or}$$

$$V_m = \frac{V_{in}}{V_{max}} \text{ when } V_{min} \geq 0$$

where $V_m$ are the transformed values for the curves, $V_{in}$ are the collect values for the curves undergoing transformation, $V_{max}$ is the select maximum value for the curves, and $V_{min}$ is the selected minimum value for the curves. In the case of FIGS. 11 and 12, the curves have been normalized such that the curves range between 0 and 1.

Classification involves selecting the desired output Tj for each curve in the group of curves. In the case of FIGS. 11 and 12, the curves may be classified as stable front and unstable front and a desired output Tj selected for each. One skilled in the art would realize that the group of curves may contain additional curves other than those illustrated in FIGS. 11 and 12.

Next, the group curves that have been transformed for classification are divided into a first set of curves and a second set of curves (stage 1330). The first set of curves is used to train network 900 (stage 1340) by inputting the curves as vector X into network 900. Training of network 900 continues until a desired learning is achieved. In network 900, training stops when the root mean square errors between desired output Tj and outputs Yj are reduced to a predetermined error. The predetermined error is selected based on required accuracy of network. For high accuracy, the predetermined error is set to a small value.

When training comes to an end, weights of network 900 will be set, through learning, to values that will allow classification of curves. Network 900 may be tested by inputting the first set of curves which is used for training network 900 (1350). Since the first set of curves was used to train network 900, network 900 should be able to classify the curves of the first set with 100% accuracy. If the accuracy is not 100%, an error in the classification of the learning samples is present. For example, identical types of curves may be given different classifications and different desired outputs Tj, thus producing inaccuracy.

After the first set of curves is verified with network 900, the second set of curves are inputted in the network 900 for classification and detection of the endpoints (stage 1360). If the recognition percentage is high for the second set, network 900 weights are reliable. Thus, network 900 is set to process curves in an etching process for endpoint detection.

If there is a need to add a new classification to network 900, a new group of training curves may be collected representing the new classification (stage 1370). Network 900 is then retrained using the new group of curves and the first group of curves.

Once network 900 has been trained (stage 1380) with the endpoint curves, an experimental endpoint curve may be input as vector X into network 900. Because network 900 has been trained, network 900 can recognize the endpoint curves from the characteristic features. One skilled in the art would realize that network 900 may be input with parts of the endpoint curve instead of the entire curve. Thus, an experimental endpoint may be processed in part and in real-time. For example, a selected portion representing a portion of the endpoint curve may be input as vector X. Thus, as the endpoint curve is received in real time, the portions which have been received may be input into network 900 to determine if a characteristic feature is present.

Figure 14A:
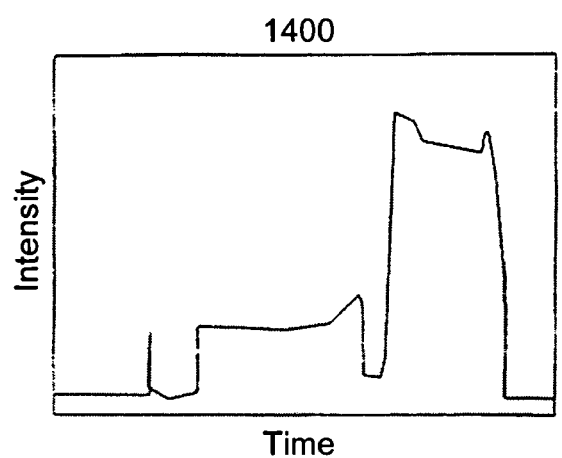
FIGS. 14A-14C are graphs illustrating exemplary recorded endpoint curves with normal features.
Figure 14B:
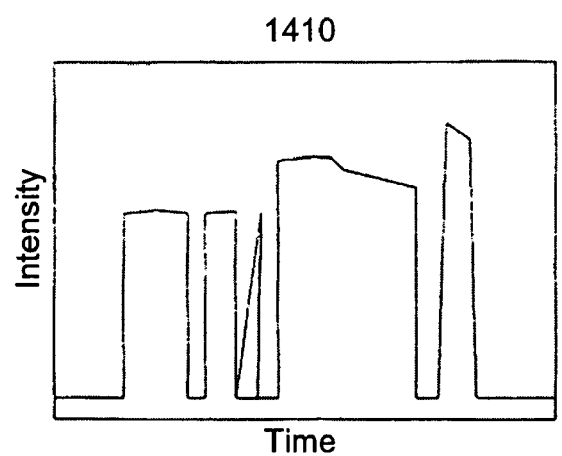
Figure 14C:
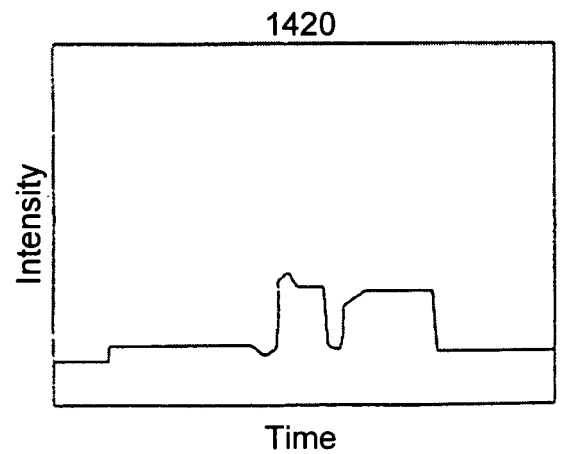
Figure 15A:
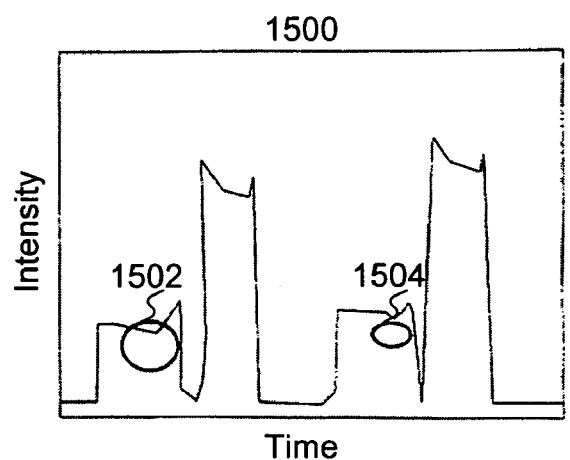
FIGS. 15A-15C are graphs illustrating exemplary recorded endpoint curves with abnormal features.
Figure 15B:
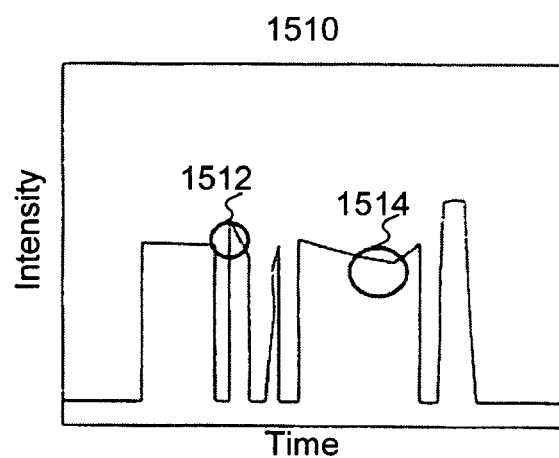
Figure 15C:
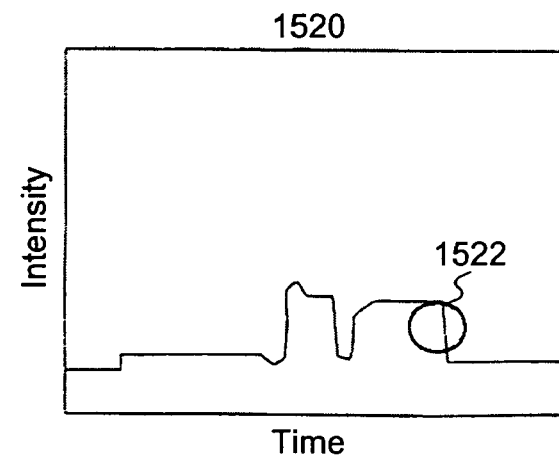

FIGS. 14A-14C are graphs illustrating exemplary training endpoint curves with normal features used to train a neural network, such as network 900. FIGS. 15A-15C are graphs illustrating training endpoint curves with abnormal features 1502, 1504, 1512, 1514, and 1522 used to train a neural network, such as network 900. Abnormal features are features in an endpoint curve which may not regularly occur in an etch endpoint curve and which may be difficult to identify in known etch systems. As in the case of the endpoint curves illustrated in FIGS. 11 and 12, network 900 is trained by setting the desired output Tj to classify the desired features and then using endpoint curves 1400, 1410, and 1420 as vector X to train network 900 according to the method illustrated in FIG. 13. The method is also repeated for endpoint curves 1500, 1510, and 1520. Once network 900 has been trained with the endpoint curves, an experimental endpoint curve may be input as vector X into network 900. Network 900 would receive an experimental endpoint curve. The experimental endpoint curve is processed by the layers of network 900. Because network 900 has been trained with exemplary training endpoint curves with normal features and abnormal features, network 900 can recognize the endpoint curves from the characteristic features.

Figure 16A:
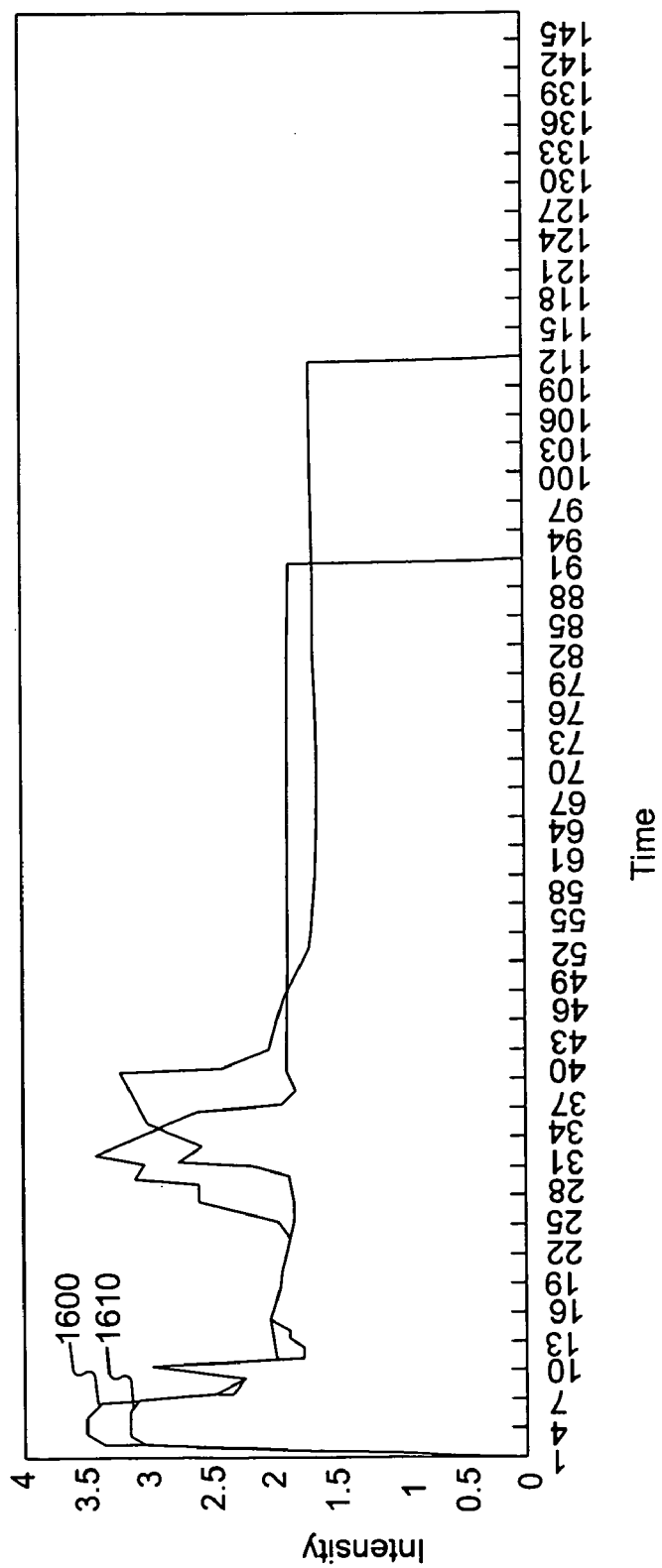
FIGS. 16A and 16B are graphs illustrating exemplary experimental endpoint curves.
Figure 16B:
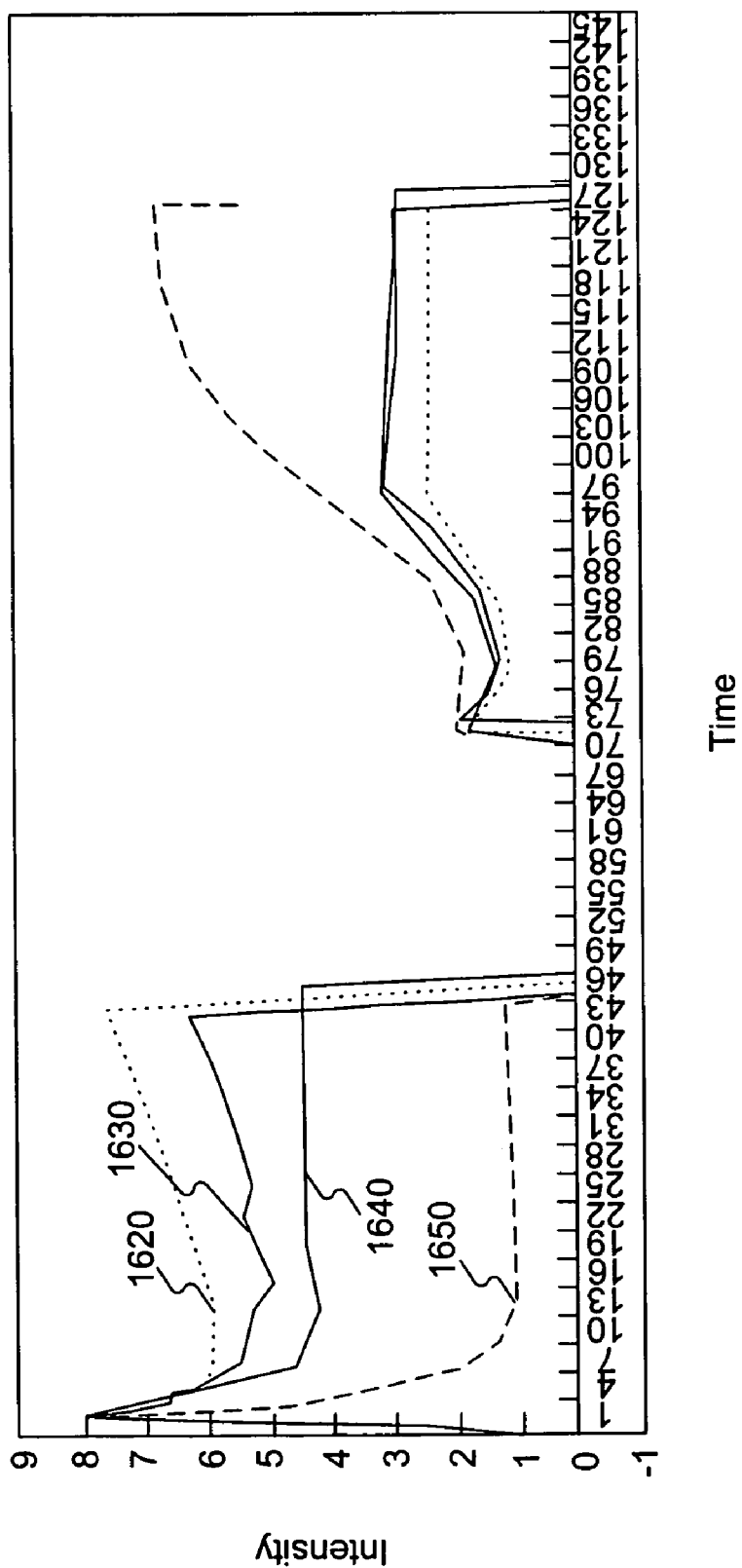

FIGS. 16A and 16B are exemplary experimental curves for endpoint determination after a neural network, such as network 900, has been trained. FIGS. 16A and 16B illustrate curves in which changes in time and output voltages of the etch endpoint curves are not identical or proportional. For example, in FIG. 16A, assuming that the etch rate is the same for curves 1600 and 1610, two semiconductor wafers with different thicknesess have different etching endpoints. In curve 1600 the etching endpoint occurs at time 91 (x axis), while in curve 1610 the etching endpoint occurs at time 112 (x axis). In FIG. 16B, for each of the curves 1620, 1630, and 1640, the different changes in voltage (y axis) may be easily observed from a visual inspection.

FIGS. 16A and 16B show that the changes in time (axis x) and output voltages (axis y) of the etch endpoint curves often do not occur at the same time. Therefore, a point-to-point matching method (i.e. visual inspection of the curve) may not be reliable in matching the curves. From a visual inspection, the profile of the curves may be classified at best as similar. However, for each of the curves, the voltages of the corresponding sites are not identical. Thus, utilizing a back propagation neural network to recognize patterns is the best method.

For such a classification, each of the experimental curves 1600, 1610, 1620, 1630, 1640, and 1650 are input separately as vector X into network 900. Network 900 will determine match features of the experimental curves with features contained in the example training endpoint curves used in the training of the network 900. Once a feature has been matched by network 900, the matched pattern is output. One skilled in the art would realize that network 900 may be input with parts of endpoint curves 1600, 1610, 1620, 1630, 1640, and 1650 instead of the entire curve. Thus, an experimental endpoint may be processed in part and in real-time.

Figure 17:
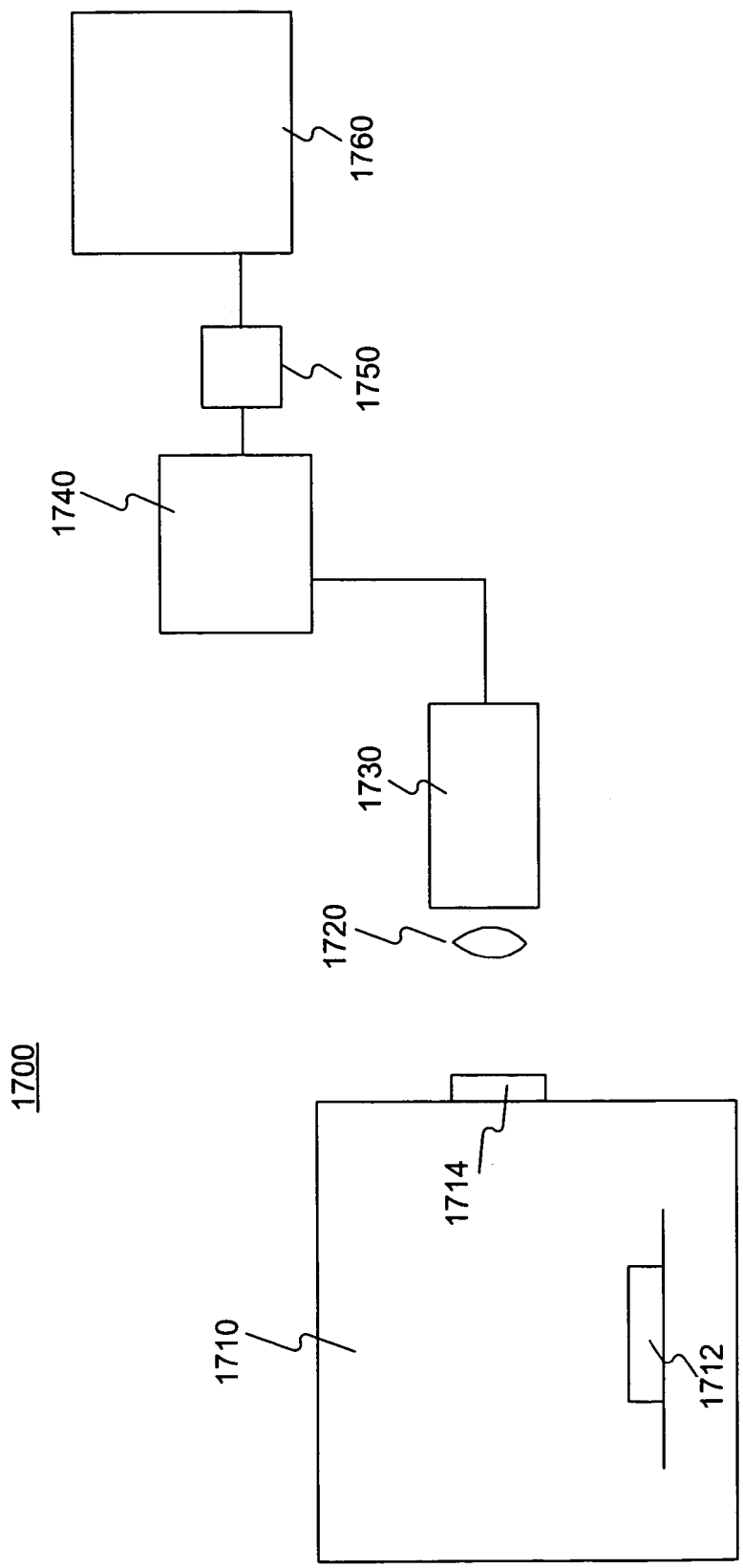
FIG. 17 is a diagram illustrating a system for endpoint detection for an etch process according to an aspect consistent with the present invention.

FIG. 17 is a diagram of a system 1700 for performing endpoint detection according to an aspect consistent with the present invention. System 1700 comprises a reaction chamber 1710 which contains a semiconductor device 1712 to be processed and a window 1714. System 1700 operates by recording with a recorder 1740, for example, a meter, oscilloscope, or chart recorder, the emission spectrum during the etch process in the presence and absence of the material that is to be etched. Emission radiation from the reaction passes through window 1714 and lens 1720 and is received by a detector 1730. Detector 1730 is equipped with a filter that lets the light of specific wavelengths pass through to be detected. For example, if SiF is to be detected in the etching of a silicon or polysilicon layer, the filter would allow light of 777 nm to pass. To detect the endpoint, the emission intensity of a particular reaction product is monitored at a fixed wavelength and recorded on a recorder 1740. An analog to digital converter (ADC) 1750 is connected to recorder 1740. ADC 1650 converts the analog signal of recorder 1740 to a digital signal and the digital signal is transferred to a computer unit 1760.

Computer unit 1760 may contain standard components for inputting, outputting, processing, manipulating, and storing data. For example, the computer unit may comprise a central processing unit (CPU), random access memory (RAM), video card, sound card, magnetic storage devices, optical storage devices, input/output (I/O) terminals, monitor, and a network interface card (NIC) (all not shown). Computer unit 1760 may optionally be connected to a printer (not shown) through the I/O terminals. Examples of the I/O terminals to which the printer may be connected are parallel, serial, universal serial bus, and IEEE 1394.

ADC 1750 may also be connected to the I/O terminals. Alternately, ADC 1750 may be a component in computer unit 1760. For example, ADC 1750 may be located on an expansion card which is internally contained in computer unit 1760.

Also, computer unit 1760 may be connected to the other computing units through a network (not shown). For example, the network may be a local area network (LAN) or wide area network (WAN), such as the Internet, or wireless network.

Computer unit 1760 is configured to perform endpoint determination using a neural network, such as the one illustrated in FIGS. 9 and 10. The neural network may be configured in the form of a process created using various programming languages or software suites. For example, neural network 900 determination may be a program written in the Java™ programming language, hypertext markup language, or C programming language. In this example, neural network 900 would be configured as a set of instructions stored on the storage unit of computer unit 1660. The CPU unit of computer unit 1760 would utilize the instruction for neural network 900 stored in the storage unit. Also, during the endpoint determination, the endpoint curve may be displayed on the monitor or printed on the printer of computer unit 1760.

One skilled in the art would realize that neural network 900 may be implemented in different forms on computer unit 1760. For example, neural network 900 may be implemented in hardware in computer unit 1760. In such an example, neural network 900 would be configured as a group of logic and processor units contained internally in computer unit 1760 or externally located and connected to computer unit 1760 via the I/O terminals.

Figure 18:
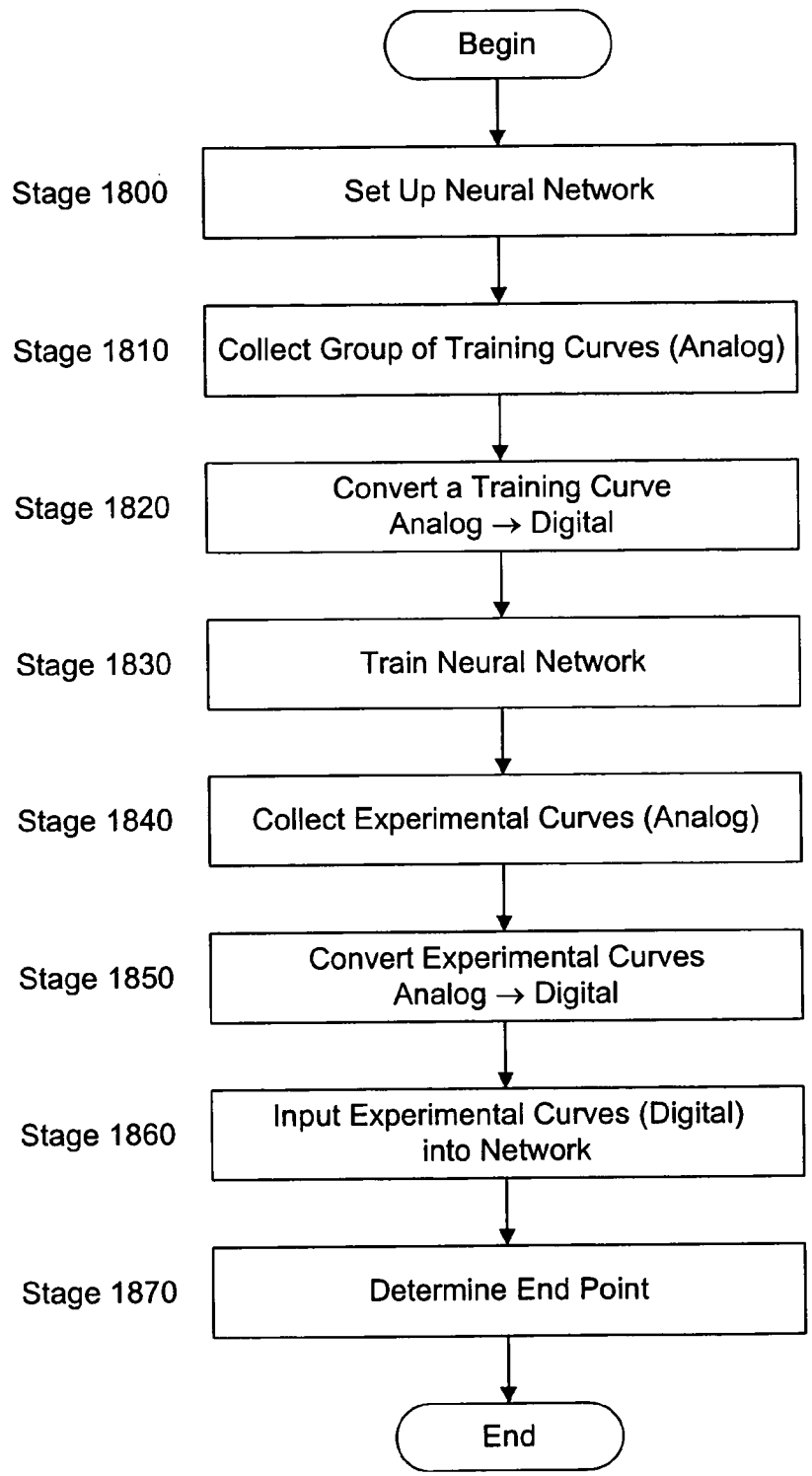
FIG. 18 is a flow diagram showing the steps in a method for endpoint detection according to the present invention.

FIG. 18 is a flowchart illustrating a method for detecting an endpoint of a curve utilizing system 1700 illustrated in FIG. 17 according to an aspect consistent with the present invention.

The method begins by setting up a neural network at computer unit 1760 (stage 1800). The neural network is set up by creating the design of the network and determining a learning rule for the network. For example, the neural network can be designed, such as network 900 illustrated in FIG. 9, using the learning rule illustrated in FIG. 10.

Next, a group of endpoint training curves are collected (stage 1810). These curves may be collected, for example, by detector 1730. These curves may also be prerecorded and stored at computer unit 1760 or generated by computer unit 1760.

Then, the group of endpoint training curves are converted from analog data to digital data (stage 1820). This may be achieved by, for example, ADC 1750. Once the data is converted, the endpoint training curves are used to train the neural network (stage 1830). Training is achieved by using a using a network training method, such as the one illustrated in FIG. 13.

Next, a group of experimental curves are collected (stage 1840). These curves may be collected, for example, by detector 1730. Then, the group of endpoint training curves are converted from analog data to digital data (stage 1850). This may be achieved by, for example, ADC 1750.

Once the data is converted, the experimental curves are input into the trained neural network (stage 1860). Based on the training from stage 1830, the neural network determines the endpoint of the experimental curves (stage 1870). Since the network has been trained to recognize different features for multiple curves, the endpoint may be determined with high accuracy.

Other aspects consistent with the present invention will be apparent to those skilled in the art from consideration of the specification and practice of the invention disclosed herein. For example, other neural network learning rules which operate as pattern classifiers may be used instead of the BP learning rule. It is intended that the specification and examples be considered as exemplary only, with a true scope and spirit of the invention being indicated by the following claims.

What is claimed is:

1. A method for pattern recognition of an endpoint curve for a process comprising:
    training a neural network with a group of training curves corresponding to the process, wherein the training curves contain normal and abnormal features;
    receiving an endpoint curve at the neural network representing a process; and
    detecting an abnormal feature in the endpoint curve.

2. The method as set forth in claim 1, wherein the neural network uses a back-propagation learning rule.

3. The method as set forth in claim 1, further comprising collecting the group of training curves.

4. The method as set forth in claim 1, further comprising identifying a normal feature from the group of training curves.

5. The method as set forth in claim 1, further comprising collecting an analog signal of the endpoint curve.

6. The method as set forth in claim 5, further comprising transforming the analog signal to a digital signal.

7. A system for pattern recognition of an endpoint curve for a process comprising:
    means for training a neural network to learn a feature corresponding to the process;
    means for receiving the endpoint curve; and
    means for detecting an abnormal feature in the endpoint curve.

8. The system as set forth in claim 7, further comprising a group of training curves corresponding to the process.

9. The system as set forth in claim 8, further comprising means for collecting the group of training curves.

10. The system as set forth in claim 7, further comprising means for collecting an analog signal of the endpoint curve.

11. The system as set forth in claim 10, further comprising means for transforming the analog signal to a digital signal.

12. The system as set forth in claim 7, further comprising means for comparing the endpoint curve with the feature.

13. The system as set forth in claim 7, wherein the means for training the neural network uses a back-propagation learning rule.

14. A computer readable medium including instructions for performing a method, when executed by a processor, for pattern recognition of an endpoint curve for a process comprising:
    training a neural network with a group of training curves corresponding to the process, wherein the training curves contain normal and abnormal features;
    receiving an endpoint curve at the neural network representing a process; and
    detecting an abnormal feature in the endpoint curve.

15. The computer readable medium as set forth in claim 14, wherein the neural network uses a back-propagation learning rule.

16. The computer readable medium as set forth in claim 14, further comprising collecting the group of training curves.

17. The computer readable medium as set forth in claim 14, further comprising identifying a normal feature from the group of training curves.

18. The computer readable medium as set forth in claim 14, further comprising collecting an analog signal of the endpoint curve.

19. The computer readable medium as set forth in claim 18, further comprising transforming the analog signal to a digital signal.

20. A method for pattern recognition of an endpoint curve for a process comprising:
    setting up a neural network;
    collecting a group of analog training curves;
    converting the group of analog training curves to a group of digital training curves;
    training the neural network with the group of digital training curves;
    collecting a group of analog experimental curves;
    converting the group of analog training curves to a group of digital training curves;
    inputting the group of digital experimental curves into the neural network; and
    determining by the neural network the endpoint of the group of digital training curves.

21. The method as set forth in claim 20, wherein the group of analog training curves includes at least one of a normal or abnormal curve.

22. The method as set forth in claim 20, wherein the group of analog experimental training curves includes at least one of a normal or abnormal curve.

23. The method as set forth in claim 20, wherein the neural network uses a back-propagation learning rule.

24. The method as set forth in claim 20, wherein training the neural network comprises:
    classifying the group of digital training curves;
    dividing the group of digital training curves into a first and second set of digital training curves;
    training the neural network with the first set of digital training curves;
    testing the neural network;
    inputting the second set of digital training curves into the neural network; and
    determining whether the neural network is trained.

25. The method as set forth in claim 24, wherein training the neural network further comprises:
    adding-a new classification to the group of digital training curves.

26. A system for pattern recognition of an endpoint curve for a process comprising:
    a process chamber for etching a semiconductor substrate;
    a detector for detecting radiation from the process chamber during the etching of the semiconductor substrate and producing a radiation signal;
    a recorder coupled to the detector for recording the radiation signal;
    an analog to digital converter coupled to the recorder for converting the radiation signal; and
    a pattern recognition apparatus coupled to the analog to digital converter for detecting the endpoint curve of the converted radiation signal.

27. The system as set forth in claim 26, wherein the pattern recognition apparatus comprises a neural network using a back-propagation learning rule.

* * * * *